(12) United States Patent
Kwak

(10) Patent No.: US 9,329,222 B2
(45) Date of Patent: May 3, 2016

(54) TEST DEVICE AND TEST SYSTEM OF SEMICONDUCTOR DEVICE AND TEST METHOD FOR TESTING SEMICONDUCTOR DEVICE

(71) Applicant: SK hynix Inc., Gyeonggi-do (KR)

(72) Inventor: Sug-Jun Kwak, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 333 days.

(21) Appl. No.: 13/716,527

(22) Filed: Dec. 17, 2012

(65) Prior Publication Data

US 2013/0300450 A1     Nov. 14, 2013

(30) Foreign Application Priority Data

May 11, 2012   (KR) .................. 10-2012-0050388

(51) Int. Cl.
| | | |
|---|---|---|
| G01R 31/02 | (2006.01) | |
| G01R 31/04 | (2006.01) | |
| G01R 1/067 | (2006.01) | |
| G11C 29/12 | (2006.01) | |
| G11C 29/48 | (2006.01) | |
| G11C 29/50 | (2006.01) | |

(52) U.S. Cl.
CPC ............ *G01R 31/04* (2013.01); *G01R 1/06794* (2013.01); *G11C 29/1201* (2013.01); *G11C 29/48* (2013.01); *G11C 2029/5006* (2013.01)

(58) Field of Classification Search
None
See application file for complete search history.

(56) References Cited

U.S. PATENT DOCUMENTS

| | | | | |
|---|---|---|---|---|
| 7,443,186 B2* | 10/2008 | Strid | .................. | G01R 31/2884 324/750.3 |
| 2006/0202707 A1* | 9/2006 | Harjung | ........................ | 324/754 |
| 2007/0008755 A1* | 1/2007 | Tanaka et al. | .................... | 363/72 |

FOREIGN PATENT DOCUMENTS

| | | |
|---|---|---|
| KR | 10-2008-0101455 | 11/2008 |
| KR | 10-2011-0024378 | 3/2011 |

* cited by examiner

*Primary Examiner* — Paresh Patel
(74) *Attorney, Agent, or Firm* — IP & T Group LLP

(57) ABSTRACT

A test device of a semiconductor device for testing a semiconductor device including a plurality of interface pads includes a plurality of coupling units, each configured to be coupled to a corresponding one of the plurality of interface pads, a channel configured to be coupled to the plurality of coupling units, a voltage generating unit configured to generate a test voltage applied to the channel, and a current measuring unit configured to measure a current that flows on the channel in response to the test voltage.

4 Claims, 3 Drawing Sheets

TEST DEVICE AND TEST SYSTEM OF SEMICONDUCTOR DEVICE AND TEST METHOD FOR TESTING SEMICONDUCTOR DEVICE

CROSS-REFERENCE TO RELATED APPLICATION

The present application claims priority of Korean Patent application No. 10-2012-0050388, filed on May 11, 2012, which is incorporated herein by reference in its entirety.

BACKGROUND

1. Field

Exemplary embodiments of the present invention relate to a test device and a test system of a semiconductor device and a test method for testing a semiconductor device.

2. Description of the Related Art

During a production process of a semiconductor device, a probe test is performed to determine whether a memory cell of a semiconductor device on a wafer performs a read operation or a write operation correctly. The probe test determines a malfunction of the semiconductor device by coupling a probe of a probe card to each pad of the semiconductor device on a wafer and inputting and outputting a power voltage and a signal.

However, it may be requested for a correct probe test to electrically couple the probe of the probe card to each pad of the semiconductor, for inputting and outputting the power voltage and the signal of the semiconductor device. Thus, it may be important to analyze an electrical coupling between the probe of the probe card and each pad of the semiconductor device.

In case of a conventional probe test for determining whether a probe of a probe card is coupled to a pad of a semiconductor device or not, a test current flows through the probe coupled to the pad of the semiconductor, and a voltage that is applied to the pad of the semiconductor device is measured in response to the test current. Here, a predetermined voltage level is measured if the probe is coupled to the pad of the semiconductor device, and a predetermined voltage is not measured if the probe is not coupled to the pad of the semiconductor device. In other words, if the probe is not coupled to the pad of the semiconductor device, a measured voltage level has a lowest value of a voltage measurement range.

Meanwhile, a plurality of probes is used in one channel of a test device because of a limited number of channels of a test device during a probe test. Thus, it is requested to analyze an electrical coupling between the plurality of probes and a plurality of interface pads of the semiconductor device before the probe test is performed.

In a case of conventional probe test method, after a test current flows to a plurality of probes coupled to each pad of the semiconductor device, an electrical coupling is analyzed between the plurality of probes and each pad of the semiconductor by using a voltage outputted in response to the test current. However, because a plurality of probes is coupled to one channel of the test device in parallel, a voltage is measured although one of the plurality of probes is coupled to a pad of a semiconductor device. The voltage may be maintained constantly irrespective of a number of the probes that is coupled to the pad. Furthermore, the voltage is measured irrespective of a coupling strength state between the probes and the pad. Thus, it may be difficult to analyze whether each of probes is coupled to the pad or not and analyze a coupling strength state between each of probes and the pad.

SUMMARY

Exemplary embodiments of the present invention are directed to a test device and a test system of a semiconductor device, and a method for testing a semiconductor device, including analyzing a coupling state between a plurality of probes and a plurality of pads of a semiconductor device, and analyzing a coupling strength state between each pad of the semiconductor device and the plurality of probes by applying a test voltage to the plurality of probes, and measuring a current, that flows on the plurality of probes in response to the test voltage.

In accordance with an exemplary embodiment of the present invention, a test device of a semiconductor device for testing a semiconductor device having a plurality of interface pads, includes a plurality of coupling units, each configured to be coupled to a corresponding one of the plurality of interface pads, a channel configured to be coupled to the plurality of coupling units, a voltage generating unit configured to generate a test voltage applied to the channel, and a current measuring unit configured to measure a current that flows on the channel in response to the test voltage In accordance with another exemplary embodiment of the present invention, a test system of a semiconductor device includes a semiconductor device configured to includes a plurality of interface pads for inputting or outputting a signal; and a test device including a plurality of coupling units, each configured to be coupled to a corresponding one of the plurality of interface pads, and a channel coupled to the plurality of coupling units, wherein the test device applies a test voltage to the channel and measures a current that flows on the channel in response to the test voltage.

In accordance with still another exemplary embodiment of the present invention, a test method for testing a semiconductor device having a plurality of interface pads includes coupling a plurality of coupling units to a plurality of interface pads; applying a test voltage to a channel coupled to the plurality of coupling units and measuring a current that flows on the channel in response to the test voltage.

DETAILED DESCRIPTION

Figure 1:
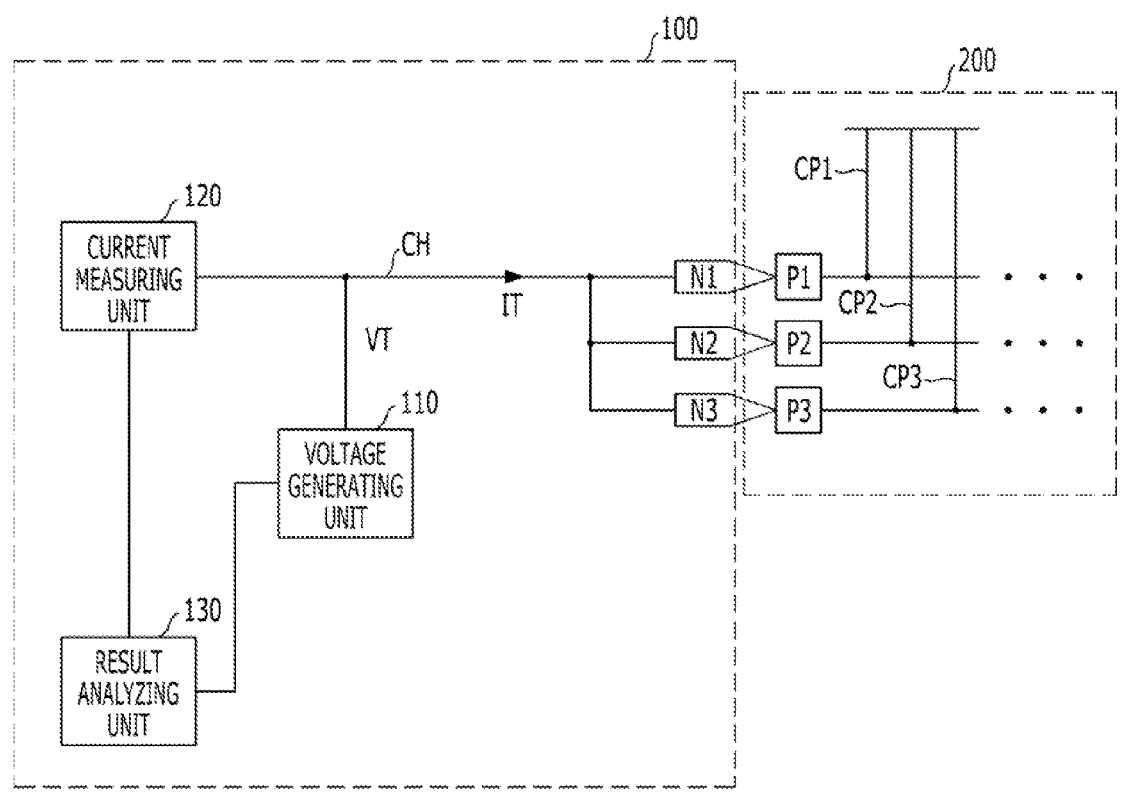
FIG. 1 is a diagram illustrating a test device in accordance with an embodiment of the present application.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram illustrating a test device in accordance with an embodiment of the present application.

As shown in FIG. 1, a test device 100 of a semiconductor device 200 including a plurality of interface pads P1 to P3, includes a plurality of coupling units N1 to N3, a channel CH configured to be coupled to the plurality of coupling units N1 to N3, a voltage generating unit 110, a current measuring unit 120 and a result analyzing unit 130. The voltage generating unit 110 generates a test voltage VT, and the test voltage VT is applied to the channel CH. The current measuring unit 120 measures a current IT that flows on the channel CH in response to the test voltage VT. The result analyzing unit 130 analyzes whether each of the plurality of coupling units N1 to N3 is coupled to each of the plurality of interface pads P1 to P3 or not by using the test voltage VT and the current IT. The result analyzing unit 130 analyzes a coupling strength between the plurality of coupling units N1 to N3 and the plurality of interface pads P1 to P3.

In another embodiment of the present application, the coupling units N1 to N3 may be probes that are coupled to a channel of a probe card.

As referring to FIG. 1, the test device 100 for testing the semiconductor device applies a plurality of signals to the semiconductor device 200, analyzes a signal output from the semiconductor device 200, and generates a test result of the semiconductor device 200.

Since this application relates to analyze a coupling state between the plurality of coupling units N1 to N3 coupled to the channel CH and the plurality of interface pads P1 to P3 it will be omitted that the plurality of signals is applied to the semiconductor device 200, and an output signal of the semiconductor device 200 is analyzed.

The test device 100 couples the plurality of coupling units N1 to N3 to the plurality of interface pads P1 to P3, and tests a fully coupling state between the plurality of coupling units N1 to N3 and the plurality of interface pads P1 to P3. The fully coupling state indicates that the plurality of coupling units N1 to N3 is electrically coupled to the plurality of interface pads P1 to P3 with a predetermined coupling strength. In the fully coupling state, there is no problem for testing the semiconductor device 200 by analyzing a signal output from the semiconductor device after the test device 100 applies a predetermined signal to the semiconductor device 200.

Hereinafter, it is referred to as 'a coupling test' for analyzing the fully coupling state between the plurality of coupling units N1 to N3 and the plurality of interface pads P1 to P3.

During the coupling test, the voltage generating unit 110 generates the test voltage VT that is applied to the channel CH coupled to the plurality of coupling units N1 to N3. The test voltage VT is transferred to the plurality of coupling units N1 to N3 through the channel CH, and is applied to the plurality of interface pads P1 to P3 through the plurality of coupling units N1 to N3.

When each of the plurality of coupling units N1 to N3 is coupled to each of the interface pads P1 to P3, a voltage level of the test voltage VT is required so that the current measuring unit 120 of the test device 100 can correctly measure a current that flows on the plurality of interface pads P1 to P3 in response to the test voltage VT.

For example, if the test voltage VT has a very low voltage level, because a current does not flow on the plurality of interface pads P1 to P3, it may be difficult to correctly measure the coupling state and a current variation between the plurality of coupling units N1 to N3 and the plurality of interface pads P1 to P3. If the test voltage VT has a very high voltage level, because an over-current flows on the plurality of interface pads P1 to P3, the test device 100 and the semiconductor device 200 may be damaged.

The current measuring unit 120 measures the current that flows on the channel CH in response to the test voltage VT. The plurality of coupling units N1 to N3 is coupled to one channel that is one node in view of an electronic circuit. In other words, the plurality of coupling units N1 to N3 is coupled to one node in parallel. Thus, the amount of a current that flows on the channel, is a sum of the amount of the current that flows between each of the plurality of coupling units N1 to N3 and each of the plurality of interface pads P1 to P3 coupled to the each of the plurality of coupling units N1 to N3 in response to the test voltage VT.

The amount of the current that flows between one coupling unit and one interface pad coupled to the coupling unit is determined by a coupling strength between the coupling unit and the interface pad. As the coupling strength between the coupling unit and the interface pad is increased, a resistance value of a path on which a current flows is decreased and the amount of the current between the coupling unit and the interface pad is increased. As the coupling strength between the coupling unit and the interface pad is decreased, a resistance value of the path on which the current flows is increased and the amount of the current between the coupling unit and the interface pad is decreased. When the coupling unit is not coupled to the interface pad, the current does not flows between the coupling unit and the interface pad.

Moreover, as the current that flows between each of the plurality of coupling units N1 to N3 and each of the plurality of interface pads P1 to P3 is increased and a number of the coupling units N1 to N3 is increased, the amount of the current that flows on the channel CH in response to the test voltage VT is increased. In other words, as each of the plurality of coupling units N1 to N3 is strongly coupled to each of the plurality of interface pads P1 to P3 and the number of interface pads P1 to P3 coupled to the each of the coupling units N1 to N3 is increased, the amount of the current that flows on the channel CH in response to the test voltage VT is increased.

As shown in FIG. 1, a first coupling unit N1 is coupled to a first interface pad P1, a second coupling unit N2 is coupled to a second interface pad P2, and a third coupling unit N3 is coupled to a third interface pad P3.

The amount of the current that flows on the channel CH is determined according to a coupling strength between the first coupling unit N1 and the first interface pad P1, a coupling strength between the second coupling unit N2 and the second interface pad P2, and a coupling strength between the third coupling unit N3 and the third interface pad P3.

In other words, as the coupling strength between the first coupling unit N1 and the first interface pad P1, between the second coupling unit N2 and the second interface pad P2, and between the third coupling unit N3 and the third interface pad P3 is increased, the amount of the current that flows on the channel CH is increased.

Although each of the plurality of coupling units N1 to N3 is fully coupled to each of the plurality of interface pads P1 to P3, if a circuit including the plurality of interface pads N1 to N3 and the plurality of coupling units P1 to P3 is an open circuit, the current does not flow between the plurality of interface pads N1 to N3 and the plurality of coupling units P1 to P3, and each of the plurality of interface pads P1 to P3 is coupled to each of a plurality of current paths CP1 to CP3.

Each of the plurality of current paths CP1 to CP3 may include a resistive element (not shown) or a diode (not shown), each having a resistance value, so that the test device 100 and the semiconductor device 200 are prevented from possible damage caused by an over-current or malfunction of the current measuring unit 120 due to little amount of the current when the test voltage VT is applied.

Figure 2:
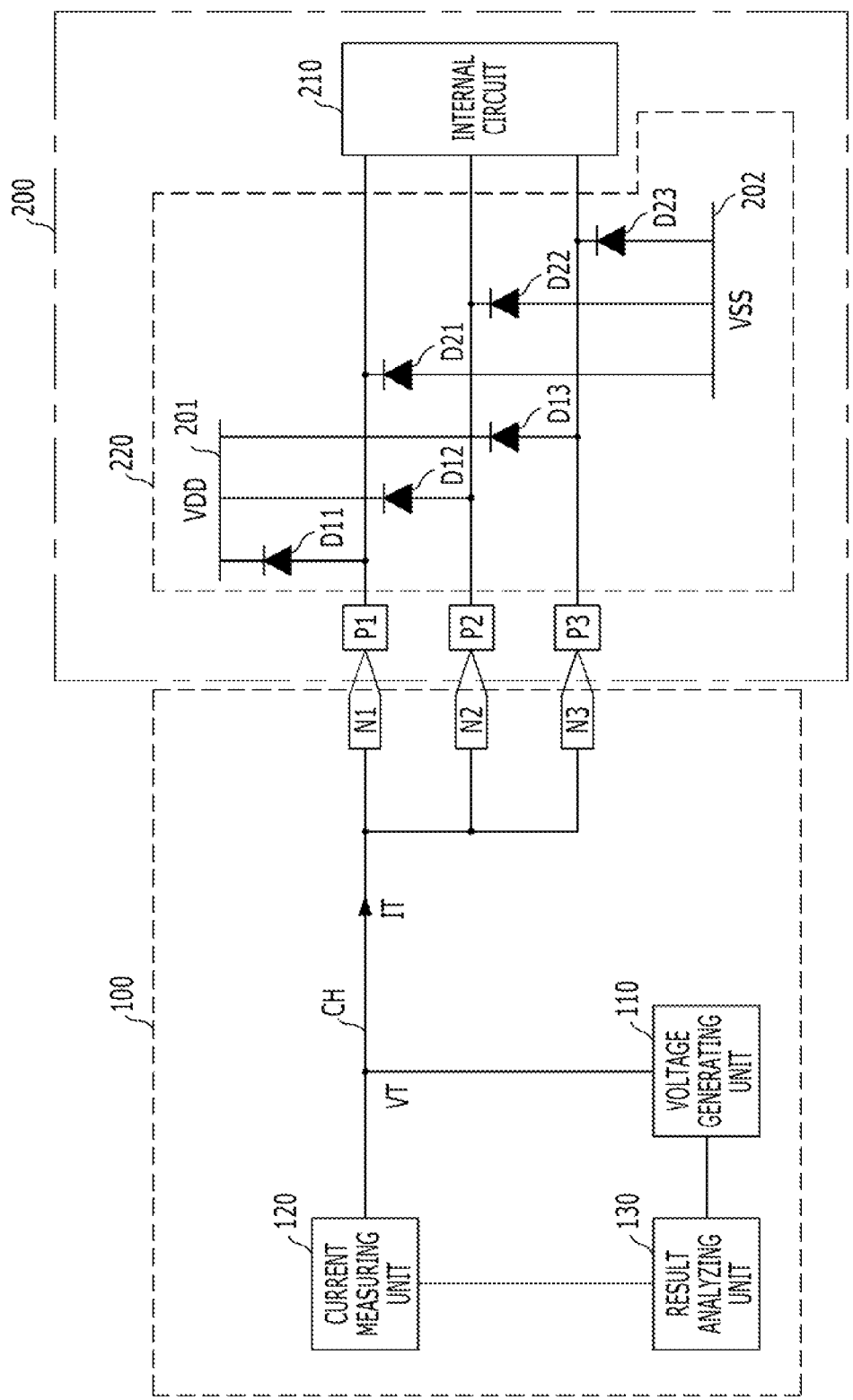
FIG. 2 is a diagram illustrating a test system in accordance with an embodiment of the present application.

An end of each current path CP1 to CP3 is coupled to each interface pad P1 to P3, and the other end of each current path CP1 to CP3 is coupled to a power voltage supply terminal 201 or a ground voltage supply terminal 202, shown in FIG. 2.

The result analyzing unit 130 analyzes a fully coupling between the plurality of coupling units N1 to N3 and the plurality of interface pads P1 to P3 by using the test voltage VT and the current that flows on the channel CH in response to the test voltage VT. The result analyzing unit 130 stores data relating to the amount of the current that flows on the channel CH according to a coupling strength between each coupling unit N1 to N3 and each interface pad P1 to P3, and the amount of the current that flows on the channel CH according to a number of the coupling units N1 to N3 coupled to the interface pads P1 to P3. The result analyzing unit 130 compares the stored data with the test voltage VT applied to the channel CH and a value measured by the current measuring unit 120. Also, the result analyzing unit 130 determines the number of the coupling units N1 to N3 coupled to the interface pads P1 to P3 and the coupling strength between each coupling unit N1 to N3 and each interface pad P1 to P3, based on the compared result.

In case that the plurality of coupling units N1 to N3 that is coupled to the plurality of interface pads P1 to P3 of the semiconductor device 200, is coupled to the one channel CH during a coupling test, the test device 100 in accordance with an embodiment of the present application acquires the number of coupling units N1 to N3 coupled to the interface pads P1 to P3 and the coupling strength between each coupling unit N1 to N3 and each interface unit P1 to P3. Thus, the test device 100 in accordance with an embodiment of the present application improves the accuracy of the coupling test highly.

In another embodiment of the present application, a number of channels, a number of coupling units coupled to one channel, and a number of interface pads may be changed according to a design of the test device.

FIG. 2 is a configuration diagram illustrating a test system in accordance with an embodiment of the present application. A test system of the semiconductor device 200 shown in FIG. 2 includes the test device 100 shown in FIG. 1.

As shown in FIG. 2, the test system of the semiconductor device 200 includes a semiconductor device 200 and a test device 100. The semiconductor device 200 includes a plurality of interface pads P1 to P3 for inputting or outputting a signal. The test device 100 includes a plurality of coupling units N1 to N3 coupled to the plurality of interface pads P1 to P3, and a channel CH coupled to the plurality of coupling units N1 to N3. The test device 100 applies a test voltage VT to the channel CH and measures a current IT that flows on the channel CH in response to the test voltage VT.

Since a detailed configuration and operation of the test device 100 is similar to that of the test device 100 shown in FIG. 1, the description of the test device 100 is omitted.

The semiconductor device 200, as shown in FIG. 2, further includes an internal circuit 210 and an electrostatic discharge circuit 220. The internal circuit 210 performs an intrinsic operation by using a signal that is input or output through the plurality of interface pads P1 to P3. For example, in a semiconductor device, an internal circuit receives a command, an address and data, and performs a read operation or a write operation. In an arithmetic device, an internal circuit receives a plurality of signals and performs an arithmetic operation.

The electrostatic discharge circuit 220 protects the internal circuit 210 from an electrostatic that is input from the plurality of interface pads P1 to P3 and from a power noise that is input through the plurality of interface pads P1 to P3.

The electrostatic discharge circuit 220 includes a power voltage supply terminal 201, a plurality of first diodes D11 to D13, a ground voltage supply terminal 202 and a plurality of second diodes D21 to D23.

In case that a voltage of the plurality of interface pads P1 to P3 is highly increased by receiving the electrostatic or the power noise through the plurality of interface pads P1 to P3, the power voltage supply terminal 201 supplies a power voltage VDD to the internal circuit 210 for discharging an electrostatic or a power noise. The plurality of first diodes D11 to D13 is coupled to the plurality of interface pads P1 to P3.

In case that a voltage of the plurality of interface pads P1 to P3 is highly decreased, the ground voltage supply terminal 202 supplies a ground voltage VSS to the internal circuit 210 for discharging a decreased voltage. The plurality of second diodes D21 to D23 is coupled to the plurality of interface pads P1 to P3.

The plurality of first diodes D11 to D13 is respectively turned on in response to the test voltage VT that is applied through the plurality of coupling units N1 to N3, when the interface pads P1 to P3 are coupled to the plurality of coupling units N1 to N3. The current between the plurality of interface pads P1 to P3 and the power voltage supply terminal 201 flows through the plurality of first diodes D11 to D13. As described above, the plurality of first diodes D11 to D13 performs an operation of the current paths CP1 to CP3 shown in FIG. 1.

When the plurality of coupling units N1 to N3 is coupled to the plurality of interface pads P1 to P3, the test voltage VT may be a voltage higher than a voltage of sum of the power voltage VDD and a threshold voltage VTH (not shown) of one of the plurality of first diodes D11 to D13, so that the current flows through the plurality of first diodes D11 to D13. A numerical expression of the correlation among the test voltage VT, a power voltage VDD and the threshold voltage VTH of one of the plurality of first diodes D11 to D13 is defined as 'VT≥VDD+VTH'.

If the test voltage VT is applied to the channel CH, the test voltage VT is transferred to the plurality of interface pads P1 to P3 via the plurality of coupling units N1 to N3. A voltage applied in a forward direction of the plurality of first diodes D11 to D13 is a difference voltage between the test voltage VT and the power voltage VDD. If the correlation among the test voltage VT, the power voltage VDD and the threshold voltage VTH of one of the plurality of diodes D22 to D13 is satisfied by the numerical expression of 'VT≥VDD+VTH', a current path is established between the power voltage supply terminal 201 and the plurality of interface pads P1 to P3 since the difference voltage between the test voltage VT and the power voltage VDD is higher than the threshold voltage VTH of one of the plurality of diodes D11 to D13.

During the coupling test, an operation of the test device 100 is similar to that of the test device 100 shown in FIG. 1. Thus, the test system of the semiconductor device shown in FIG. 2 has a similar effect to the test device 100 of the semiconductor device shown in FIG. 1.

Figure 3:
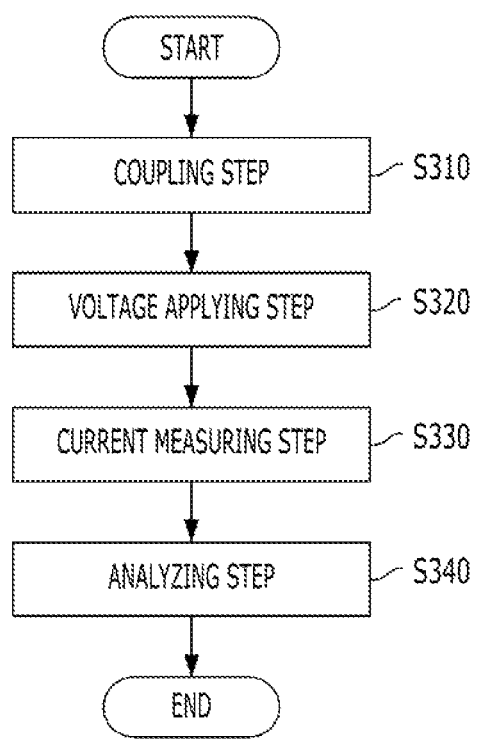
FIG. 3 is a diagram illustrating a test method of a semiconductor device in accordance with an embodiment of the present application.

FIG. 3 is a configuration diagram illustrating a test method of a semiconductor device n accordance with an embodiment of the present application.

As shown in FIGS. 1 to 3, a test method of the semiconductor device having the plurality of interface pads P1 to P3 includes coupling the plurality of coupling units N1 to N3 to the plurality of interface pads P1 to P3 (Hereinafter, 'coupling step S310'), applying the test voltage VT to the channel CH coupled to the plurality of coupling units N1 to N3 (Hereinafter, 'voltage applying step S320'), measuring the current IT that flows on the channel CH in response to the test voltage VT (hereinafter, 'current measuring step S330'), and analyzing a coupling state and a coupling strength between the plurality of coupling units N1 to N3 and the plurality of interface pads P1 to P3 by using the test voltage VT and the current IT (hereinafter, 'analyzing step S340').

Referring to FIGS. 1 to 3, in the coupling step S310, the plurality of coupling units N1 to N3 coupled to the channel CH of the test device 100 is coupled to the plurality of interface pads P1 to P3 of the semiconductor device. The coupling state between the plurality of coupling units N1 to N3 and the plurality of interface pads P1 to P3 represents that the plurality of coupling units N1 to N3 is located within a predetermined range from the plurality of interface pads P1 to P3. The coupling state between the plurality of coupling units N1 to N3 and the plurality of interface pads P1 to P3 is electrically checked as follows.

When the coupling step S310 is completed, in the voltage applying step S320, the test device 100 generates the test voltage VT and applies the test voltage VT to the channel CH. The test voltage VT is then applied to the plurality of interface pads P1 to P3 of the semiconductor device 200 through the plurality of coupling units N1 to N3 that is coupled to the channel CH.

Subsequently, the current flows between each of the plurality of coupling units N1 to N3 and each of the plurality of interface pads P1 to P3 in response to the test voltage VT applied in the voltage applying step S320.

Since the plurality of coupling units N1 to N3 is coupled to the channel CH of one node in parallel, the current having the amount same as the sum of the current that flows between each of the plurality of coupling units N1 to N3 and each of the plurality of interface pads P1 to P3, flows on the channel CH.

In the current measuring step S330, the test device 100 measures the amount of the current that flows on the channel CH in response to the test voltage VT. The amount of the current that flows on the channel CH is increased as the number of the coupling units N1 to N3 coupled to the interface pads P1 to P3 is increased and the coupling strength between the coupling units N1 to N3 and the interface pads P1 to P3 is increased.

In the analyzing step S340, the test device 100 analyzes the coupling state and the coupling strength between the plurality of coupling units N1 to N3 and the plurality of interface pads P1 to P3 based on the test voltage VT applied in the voltage applying step S320 and the current measured in the current measuring step S330.

The test method of the semiconductor device in accordance with an embodiment of the present application has a same effect as the test device of the semiconductor device shown in FIG. 1.

While the present invention has been described with respect to the specific embodiments, it will be apparent to those skilled in the art that various changes and modifications may be made without departing from the spirit and scope of the invention as defined in the following claims.

What is claimed is:

1. A test device of a semiconductor device for testing a semiconductor device having a plurality of interface pads, comprising:
    a plurality of coupling units, each configured to be coupled to a corresponding one of the plurality of interface pads;
    a channel coupled to the plurality of coupling units, wherein the plurality of coupling units are electrically coupled to the channel at a single common node in parallel;
    a voltage generating unit configured to generate a test voltage to be applied to the plurality of coupling units through the single common node of the channel; and
    a current measuring unit configured to measure a current that flows on the channel through the single common node from the plurality of coupling units in response to the test voltage,
    wherein, as a number of the plurality of coupling units coupled to the plurality of interface pads is increased and a coupling strength between the plurality of coupling units and the plurality of interface pads is increased, the current which flows on the channel in response to the test voltage is increased.

2. The test device of the semiconductor device of claim 1, further comprising:
    a result analyzing unit configured to analyze a coupling state and a coupling strength between each of the plurality of coupling units and the corresponding one of the plurality of interface pads based on the test voltage, and the current which flows on the channel in response to the test voltage.

3. The test device of the semiconductor device of claim 1, wherein each of the plurality of interface pads is coupled to a current path.

4. The test device of the semiconductor device of claim 3, wherein the current path includes a resistance element or a diode.

* * * * *